United States Patent
Lim et al.

(10) Patent No.: US 11,800,756 B2
(45) Date of Patent: Oct. 24, 2023

(54) DISPLAY APPARATUS INCLUDING STRUCTURE FOR PROTECTING FROM EXTERNAL MATERIALS

(71) Applicant: LG Display Co., Ltd., Seoul (KR)

(72) Inventors: Byung-Jun Lim, Paju-si (KR); Hyun-Chul Um, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 160 days.

(21) Appl. No.: 17/108,506

(22) Filed: Dec. 1, 2020

(65) Prior Publication Data

US 2021/0183985 A1 Jun. 17, 2021

(30) Foreign Application Priority Data

Dec. 11, 2019 (KR) ........................ 10-2019-0164575

(51) Int. Cl.
*H10K 59/131* (2023.01)
*H10K 50/84* (2023.01)

(52) U.S. Cl.
CPC ........... *H10K 59/131* (2023.02); *H10K 50/84* (2023.02)

(58) Field of Classification Search
CPC .......................... H01L 27/3276; H01L 51/5237
USPC ......................................................... 257/40
See application file for complete search history.

(56) References Cited

U.S. PATENT DOCUMENTS

| | | | |
|---|---|---|---|
| 9,000,428 B2 | 4/2015 | Lee et al. | |
| 9,312,319 B2 | 4/2016 | Lee et al. | |
| 9,466,810 B2 | 10/2016 | Lee et al. | |
| 9,659,966 B2 | 5/2017 | Kwak et al. | |
| 10,135,028 B2 | 11/2018 | Kim et al. | |
| 10,347,866 B1 | 7/2019 | Kim | |
| 10,446,081 B2 | 10/2019 | Pyon | |
| 10,522,431 B2 | 12/2019 | Kim et al. | |
| 10,804,487 B2 | 10/2020 | Nakada et al. | |
| 2016/0315284 A1* | 10/2016 | Jeon | H01L 51/5246 |
| 2017/0287995 A1* | 10/2017 | Kim | H01L 27/3276 |
| 2019/0131572 A1 | 5/2019 | Gwon et al. | |
| 2019/0237533 A1 | 8/2019 | Kim et al. | |
| 2019/0326361 A1 | 10/2019 | Gwon et al. | |
| 2020/0161406 A1* | 5/2020 | Lee | G01R 31/2837 |

FOREIGN PATENT DOCUMENTS

| | | |
|---|---|---|
| CN | 103872078 A | 6/2014 |
| CN | 105144418 A | 12/2015 |
| CN | 107437553 A | 12/2017 |
| CN | 108963105 A | 12/2018 |
| KR | 10-2016-0054822 A | 5/2016 |
| KR | 10-2017-0080224 A | 7/2017 |
| TW | 201822347 A | 6/2018 |

* cited by examiner

*Primary Examiner* — Xia L Cross
(74) *Attorney, Agent, or Firm* — Seed IP Law Group LLP

(57) ABSTRACT

A display apparatus of the present disclosure includes a display panel including an active area and an inactive area. The active area includes an anode electrode, an organic light-emitting layer, and a cathode electrode. The inactive area includes a gate driving portion and a crack stopper pattern, and further includes a connection area disposed in an area adjacent to the gate driving portion. In the connection area, the cathode electrode and a connection electrode may be in contact with each other.

20 Claims, 5 Drawing Sheets ved. Specific examples of the display apparatuses include a

DISPLAY APPARATUS INCLUDING STRUCTURE FOR PROTECTING FROM EXTERNAL MATERIALS

CROSS-REFERENCE TO RELATED APPLICATION(S)

The present application claims priority from and the benefit under 35 U.S.C § 119(a) of Korean Patent Application No. 10-2019-0164575, filed Dec. 11, 2019, which is hereby incorporated by reference in its entirety.

BACKGROUND

Technical Field

The present disclosure relates to a display apparatus.

Description of the Related Art

Recently, with entering into the information age, the field of display visually expressing electrical information signals has been promptly developed, and in response to this, various display apparatuses with excellent performance of a thin profile, light weight and low power consumption have been developed.

Specific examples of the display apparatuses include a liquid crystal display apparatus (LCD), an organic light emitting display apparatus (OLED), a quantum dot display apparatus, and so on.

The OLED may include a display panel and a plurality of components for providing various functions. For example, one or more display driving circuits for controlling a display panel may be included in a display assembly. Examples of driving circuits include gate drivers, light-emitting (source) drivers, power (VDD) routing, electrostatic discharge (ESD) circuits, multiplex (MUX) circuits, data signal lines, cathode contacts, and outer functional elements. A plurality of peripheral circuits for providing various types of additional functions, for example, touch sensing or fingerprinting identification functions, may be included in the display assembly. Some components may be disposed on the display panel itself or may be disposed on areas adjacent to a display area, which are non-display areas and/or inactive or non-active areas. In addition, an organic light-emitting device used in an organic light-emitting display apparatus is a self-luminous device in which a light-emitting layer is formed between two electrodes. The organic light-emitting device is a device that emits light when an exciton, which is generated by injecting and combining an electron and a hole inside from an electron injection electrode and a hole injection electrode, respectively, falls from the exited state into the ground state. The electron injection electrode may be an upper electrode or a cathode, and the hole injection electrode may be a lower electrode or an anode. It is beneficial to connect the upper electrode to a low voltage supply line, and a contact structure for connection may be disposed in the inactive area.

The size of the display apparatus is a very important factor in design, and particularly, a high ratio of the size of the active area to the size of the inactive area, which is referred to as a ratio of a screen to a bezel, may be one of main characteristics. However, disposing some of the above-described components in the display assembly and disposing the contact structure of the upper electrode and the lower voltage supply line outside require a relatively large inactive area. The contact structure of the upper electrode and the lower voltage supply line disposed outside the component may be easily exposed to permeation of external moisture generated at a trimming line in an outmost inactive area of a substrate or from cracks at the trimming line of the substrate. Accordingly, to protect the elements from permeation of the external moisture, in the outside of the contact structure of the upper electrode and the lower voltage supply line, a certain distance is needed from the trimming line of the substrate, and there is a limitation on reducing the bezel area.

BRIEF SUMMARY

The inventors of the present disclosure have recognized that various technologies including arrangement of the components such as the gate driver or the ESD and an optimal driving method are beneficial in order to implement a narrow bezel in which a size of the inactive area is reduced. Accordingly, the inventors of the present disclosure conducted various experiments about the arrangement of the components that can protect the organic light-emitting devices in the active area well while efficiently using a space of the inactive area. Through several experiments, a new structure in which the upper electrode constituting the organic light-emitting device and the lower voltage supply line contact each other was invented.

For example, an isolation area may be provided in the inactive area of an organic insulation layer, which is one of paths through which external moisture permeates the active area. The organic insulation layer has been removed outside a gate-in-panel (GIP) area of the inactive area to prevent moisture permeation, but the isolation area of the organic insulation layer may also be provided in the GIP area. If a planarization layer, a bank layer and a spacer layer are removed for a certain period, an inorganic insulation layer can be the only path through the active area.

In addition, a connection structure of the upper electrode and the low voltage supply line may be provided by using the isolation area of the organic insulation layer. The upper electrode and the low voltage supply line may have a connection structure outside the GIP area, and since an additional space for the connection structure is beneficial, there was a limitation on reduction of the bezel area. As a way to reduce this limitation, it is possible to save the space of the bezel area by connecting the upper electrode and an intermediate connection electrode in the GIP area and connecting the intermediate connection electrode and the low voltage supply line outside the GIP area.

The intermediate connection electrode is beneficial in order to simplify the connection structure of the upper electrode and the low voltage supply line while forming the isolation area of the organic insulation layer. If the isolation area of the organic insulation layer is formed in the GIP area, a hole as deep as a thickness of the organic insulation layer is created. When the upper electrode is formed in a deep hole, the upper electrode may be broken or not sufficiently formed due to a thin thickness. In order to prevent such a phenomenon, the intermediate connection electrode may be disposed in the hole area, and a contact guarantee area in which the upper electrode and the intermediate connection electrode can contact each other may be formed, thereby achieving a more stable connection structure.

Through these experiments, it is possible to implement a display apparatus capable of preventing moisture permeation while reducing the inactive area of the display apparatus.

Accordingly, the present disclosure is directed to a display apparatus that substantially obviates one or more of the problems due to limitations and disadvantages of the related art.

One or more embodiments of the present disclosure provides an outer structure of an organic light-emitting display apparatus.

The problems of the related art identified in the present disclosure are not limited to the problems mentioned above, and technical solutions to other problems that are not mentioned herein will be clearly understood by those skilled in the art from the following description.

A display apparatus according to an embodiment of the present disclosure includes a display panel including an active area and an inactive area, wherein the active area includes an anode electrode, an organic light-emitting layer and a cathode electrode and the inactive area includes a gate driving portion and a crack stopper pattern, and further includes a contact area (or connection area) disposed in an area adjacent to the gate driving portion, wherein in the contact area, the cathode electrode and a connection electrode over the gate driving portion may be in contact with each other.

In another aspect, a display apparatus according to an embodiment of the present disclosure includes a display panel including an active area and an inactive area, wherein the active area includes a thin film transistor, and a planarization layer, a first electrode, a bank layer, an organic light-emitting layer and a second electrode are sequentially disposed on the thin film transistor, wherein the inactive area includes a gate driving portion, a dam structure and a crack stopper structure, and further includes a contact area in which a connection electrode disposed on the gate driving portion is connected to an extension part of the second electrode.

Details of other embodiments are included in the detailed description and drawings.

The display apparatus according to the embodiment may have a structure for disconnecting the organic insulation layers, which are connected to the active area, in the inactive area and may prevent moisture introduced from the outside from reaching the organic light-emitting device in the active area. For example, a structure partially removing and disconnecting the planarization layer and the bank layer over the gate driving portion in the inactive area may be provided, and a path through which the moisture can penetrate may be blocked by further removing an inorganic insulation layer in addition to the planarization layer and the bank layer, thereby providing a display apparatus that is resistant to the moisture permeation.

An intermediate structure for electrical connection of the cathode electrode of the organic light-emitting device and the low voltage supply line disposed in the inactive area may be provided in the structure for disconnecting the organic insulation layers in the inactive area. For example, when the connection electrode is disposed in the isolation area of the organic insulation layer and the cathode electrode is disposed above the connection electrode, the low voltage connection structure of the organic light-emitting device, which required an additional space, may be disposed to overlap with the gate driving portion. This reduces or minimizes the bezel area, so that the user of the display apparatus can use a device with an emission screen aesthetically displayed substantially all over the display apparatus, and a display device having more superior grip and light weight may be provided to the user by using a compact module to which a narrow bezel is applied.

Since the contents of the present disclosure described in the problems to be solved, the means for solving the problems, and the effects do not specify the essential features of the claims, the scope of the claims is not limited by description in the contents of the present disclosure.

BRIEF DESCRIPTION OF THE SEVERAL VIEWS OF THE DRAWINGS

The accompanying drawings, which are included to provide a further understanding of the present disclosure and which are incorporated in and constitute a part of this specification, illustrate an embodiment of the present disclosure and together with the description serve to explain the principles of the present disclosure. In the drawings.

DETAILED DESCRIPTION

Figure 1:
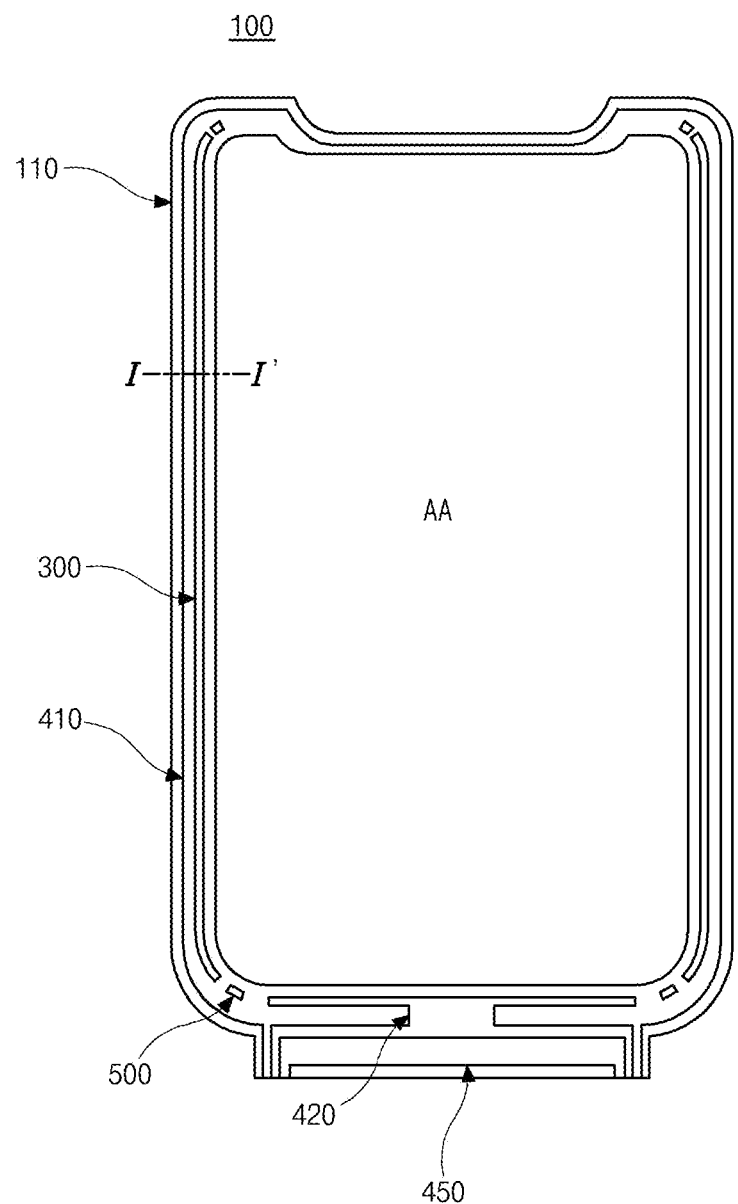
FIG. 1 is a plan view of a display panel according to an embodiment of the present disclosure.

Advantages and technical features of the present disclosure, and methods for achieving the advantages and the technical features will be clarified with reference to embodiments described below in detail together with the accompanying drawings. However, the present disclosure is not limited to the embodiments disclosed below, but will be implemented in various different forms. The embodiments allow the disclosure of the present disclosure to be complete and the ordinary skilled in the art to fully understand.

The shapes, sizes, ratios, angles, numbers, etc., disclosed in the drawings for describing the embodiments of the present disclosure are provided as examples, and the present disclosure is not limited to the drawings. The same reference numerals refer to the same components throughout the specification. In addition, in the description of the present disclosure, when it is determined that detailed descriptions of related known technologies may unnecessarily obscure the subject matter of the present disclosure, detailed descriptions thereof will be omitted. When 'include,' 'have,' 'consist of,' etc., are used in this specification, other parts may be added unless 'only' is used. When a component is expressed as a singular number, the plural number is included unless otherwise specified.

In interpreting the components, it is interpreted as including the error range even if there is no explicit description.

In the case of the description of the positional relationship, for example, when the positional relationship of two parts is described as 'on,' 'over,' 'under,' 'at a side,' etc., one or more other parts may be positioned between the two parts unless 'right' or 'direct' is used.

In the case of the description of the temporal relationship, for example, when the temporal order relationship is described as 'after,' 'continually,' etc., discontinuous cases may be included unless 'right' or 'direct' is used.

Terms 'first,' 'second,' etc., are used to describe various components, but these components are not limited by these terms. These terms are only used to distinguish one component from another component. Accordingly, the first component mentioned below may be the second component within the technical spirit of the present disclosure.

In describing the components of the present disclosure, terms of 'first,' 'second,' 'A,' 'B,' '(a),' '(b),' etc., may be used. These terms are only used to distinguish the component from other components, and the nature, turn, order, or number of the component is not limited by the terms. When a component is described as being "connected," "combined" or "contacted" to another component, the component is directly connected or contacted to the another component, but it is to be understood that another component may be "interposed" between the components or the components may be "connected," "combined" or "contacted" through another component.

In the present disclosure, a "display apparatus" may include a narrow-sense display device including a display panel and a driving portion for driving the display panel such as a liquid crystal module (LCM), an organic light-emitting module (OLED module), and a quantum dot module (QD module). In addition, the display apparatus may include a complete product or final product including an LCM, an OLED module or a QD module such as a notebook computer, a television, a computer monitor, an equipment display including an automotive display apparatus or a different type of vehicle, a set electronic device such as a mobile electronic device apparatus of a smartphone or an electronic pad, or a set device or set apparatus.

Accordingly, the display apparatus of the present disclosure may include a narrow-sense display device itself such as an LCM, an OLED module or a QD module and an applied product or a set device that is a final consumer device including an LCM, an OLED module or a QD module.

Additionally, in some cases, an LCM, an OLED module or a QD module composed of a display panel and a driving portion may be expressed as a narrow-sense "display device," and an electronic device as a complete product including an LCM, an OLED module or a QD module may be separately expressed as "a set device." For example, the narrow-sense display device may include a display panel such as a LC panel, an OLED panel or a QD panel and a source PCB that is a control unit (or a microcontroller, a microprocessor, a control circuit, or the like) for driving the display panel, and the set device may be a concept that further includes a set PCB, which is a set control unit electrically connected to the source PCB to control the entire set device.

The display panel used in the embodiment of the present disclosure may include all types of display panels such as a liquid crystal display panel, an organic light-emitting diode display panel, a quantum dot display panel, or an electroluminescent display panel and is not limited to a specific display panel capable of bending a bezel with a flexible substrate for an OLED display panel of the present embodiment and a backplane support structure thereunder. In addition, the display panel used in the embodiment of the present disclosure is not limited to the shape or size of the display panel.

For example, when the display panel is an OLED display panel, it may include a plurality of gate lines and data lines and pixels formed at crossing areas of the gate lines and the data lines. In addition, it may be configured to include an array including a thin film transistor which is an element for selectively applying a voltage to each pixel, an organic light-emitting device (OLED) layer on the array, an encapsulation substrate or encapsulation layer over the array to cover the organic light-emitting device layer, and so on. The encapsulation layer may protect the thin film transistor and the organic light-emitting device layer from the external impacts and prevent moisture or oxygen from penetrating into the organic light-emitting device layer. Further, an inorganic light-emitting layer formed on the array may include a nano-sized material layer or a quantum dot, for example.

Reference will now be made in detail to one or more embodiments of the disclosure, examples of which are illustrated in the accompanying drawings.

In the present disclosure, FIG. 1 shows an organic light-emitting diode (OLED) display panel 100 that may be integrated in display apparatuses.

FIG. 1 is a plan view of a display panel according to an embodiment of the present disclosure. Referring to FIG. 1, the OLED display panel 100 includes at least one active area AA in which light-emitting devices and an array for driving the light-emitting devices are formed.

The display panel 100 may include an inactive area disposed around the active area AA, and top, bottom, left and right of the active area AA may be referred to as the inactive area. The active area AA may have a rectangular shape or a shape with a notch and rounded corners. Various types of display apparatuses such as a circle, an oval or a polygon may be applied to a smart watch or a display apparatus for a vehicle. Accordingly, the arrangement of the inactive areas surrounding the active area AA is not limited to the OLED display panel 100 illustrated in FIG. 1. Various components for driving light-emitting devices and arrays formed in the active area AA are disposed in the left and right inactive areas of the active area AA, thereby providing a function for stable light emission. For example, there may be circuits such as a gate-in-panel (GIP) circuit 300 and an electrostatic discharge (ESD) circuit 500, an area for contact between an upper electrode or a cathode, which is a part of the light-emitting device, and a low voltage supply line (VSS) 410, which is a voltage reference point of the light-emitting device, and a plurality of dam structures, which are to prevent overflowing to the outside of the display panel 100 during a coating process of a particle compensation layer of a encapsulation layer for protecting the light-emitting device from external moisture or particles. In addition, a crack stopper structure 460 may be disposed to prevent cracks that may occur during a scribing process for dividing a mother glass into individual display panels 100 from being transferred into the inside of the display panel 100.

The crack stopper structure 460 of the present disclosure may prevent an impact generated at a trimming line of the substrate 110 during a scribing process from reaching and destroying the GIP circuit 300, the ESD circuit 500 or the low voltage supply line 410 formed in the inactive area or from providing a moisture permeation path to the light-emitting device or the array formed in the active area AA, so that it is possible to prevent growth of a dark spot or generation of pixel shrinkage.

The crack stopper structure 460 may be configured as an inorganic layer or an organic layer, or may be configured as a multilayer structure of an inorganic layer and an organic layer, but is not limited thereto. In FIG. 1, it is illustrated that the crack stopper structure 460 is disposed in both long sides and one short side of the display panel 100, but is not limited thereto.

In an area adjacent to the trimming line of the substrate 110 which is outside the crack stopper structure 460, a part or the whole of insulation layers such as a gate insulation layer (GI), a buffer layer and the like, which are deposited over the entire surface when the active area AA is formed, may be etched. A small amount of insulation layer is left on the substrate 110 or the upper surface of the substrate 110 is completely exposed through etching, so that a trimming impact may not be transferred to the corresponding insulation layer.

The display panel 100 according to an example may include a thin film transistor array substrate including a plurality of pixels defined by a plurality of gate lines and a plurality of data lines and a thin film transistor provided in each pixel for driving each pixel, an organic light-emitting device layer provided on the thin film transistor array substrate, and an encapsulation layer covering or at least partially covering the organic light-emitting device layer. Here, the encapsulation layer protects the thin film transistor and the organic light-emitting device layer from the external impact and prevents moisture from permeating the organic light-emitting device layer.

Referring to FIG. 1, an FPCB electrically connected to a pad 450 formed to receive a data driving signal or to exchange a touch signal with an external power source may be provided in a lower area of the display panel 100. A high voltage supply (VDD) line 420, a low voltage supply (VSS) line 410 and/or data voltage lines extended from the FPCB may be disposed. The low voltage supply line 410 is used to form a reference voltage of the device in the active area AA, and may be disposed to surround the active area AA in order to lower resistance. The low voltage supply line 410 may be disposed to surround three sides of the active area AA except for one side on which the pad 450 is disposed, and may have a connection structure for being connected to the upper electrode.

The data voltage line of the present disclosure may be disposed to be connected to a data driver IC that generates a light-emitting signal of the light-emitting device.

An area in which the pad 450 described above is disposed may be a second component formation portion. The high voltage supply line 420 and a part of the low voltage supply line 410 may be disposed in the second component formation portion.

A member connected to the pad 450 formed on the upper surface of the display panel 100 is not limited to the FPCB, various members can be connected, and the pad 450 may be disposed on the upper surface or the rear surface of the display panel 100.

The substrate 110 that is the basis of the display panel 100 may be formed of various materials such as glass, metal or plastic. When the substrate 110 is a flexible substrate, the substrate 110 may include a polymer resin such as polyethersulphone (PES), polyacrylate (PAR), polyetherimide (PEI), polyethylene naphthalate (PEN), polyethyleneterephthalate (PET), polyphenylene sulfide (PPS), polyarylate, polyimide (PI), polycarbonate (PC), or cellulose acetate propionate (CAP), for example. In addition, the substrate 110 may have a structure including two plastic substrates and an inorganic layer between the two plastic substrates. The two plastic substrates may include the above-mentioned polymer resin and may have the same thickness or different thicknesses. For example, each of the two plastic substrates may include polyimide and may have a thickness of 3 µm to 20 µm. The inorganic layer is a barrier layer that prevents penetration of particles from the outside and may be a single layer or a multilayer including an inorganic material such as silicon nitride (SiNx) and/or silicon oxide (SiOx). The inorganic layer may have a thickness of about 6000 Å, but is not limited thereto.

Figure 2:
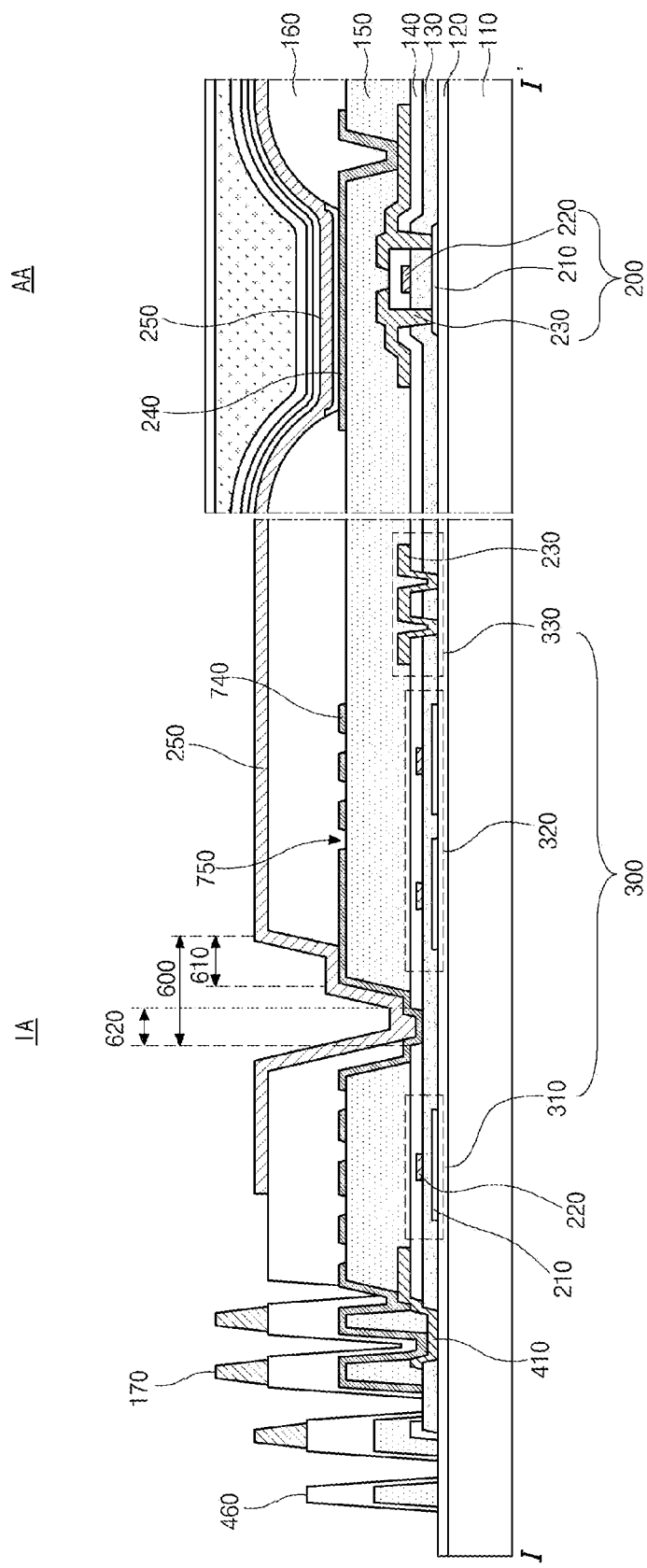
FIG. 2 is a cross-sectional view of a display panel according to an embodiment taken along the cutting line I-I' of FIG. 1.

FIG. 2 shows a cross-section of the cutting line I-I' of FIG. 1. A thin film transistor 200 is disposed in an active area AA of the substrate 110. In addition to the thin film transistor 200, a display device electrically connected to the thin film transistor 200 may be disposed. In FIG. 2, an organic light-emitting device is shown as the display device. Hereinafter, it will be described that the display panel 100 according to the embodiment of the present disclosure includes an organic light-emitting device as the display device. The fact that the organic light-emitting device, which is the display device, is electrically connected to the thin film transistor 200 may be understood that an anode 240 included in the organic light-emitting device is electrically connected to the thin film transistor 200. The thin film transistor 200 may also be disposed in an inactive area IA of peripheries of the substrate 110. The thin film transistor 200 disposed in the inactive area IA may be a part of a circuit portion for controlling an electrical signal applied to the active area AA.

The thin film transistor 200 includes a semiconductor layer 210 including amorphous silicon, polycrystalline silicon or an organic semiconductor material, a gate electrode 220, and source/drain electrodes 230. A buffer layer 120 formed of silicon oxide, silicon nitride or silicon oxynitride may be disposed on the substrate 100 in order to flatten a surface of the substrate 110 or prevent impurities from penetrating the semiconductor layer 210, and the semiconductor layer 210 may be disposed on the buffer layer 120.

The gate electrode 220 may be disposed on the semiconductor layer 210. The gate electrode 220 may be formed of one or more of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), for example, and may be a single layer or a multilayer in consideration of adhesion to adjacent layers, surface flatness of the layer to be stacked, and processability. At this time, a gate insulation layer 130 formed of silicon oxide, silicon nitride or silicon oxynitride may be interposed between the semiconductor layer 210 and the gate electrode 220 in order to secure the insulation between the semiconductor layer 210 and the gate electrode 220. An inorganic insulation layer 140 may be disposed on the gate electrode 220. The inorganic insulation layer 140 may be formed of silicon oxide, silicon nitride, or silicon oxynitride and may be a single layer or a multilayer.

The source/drain electrodes 230 are disposed on the inorganic insulation layer 140. The source/drain electrodes 230 are electrically connected to the semiconductor layer 210 through respective contact holes formed in the inorganic insulation layer 140 and the gate insulation layer 130.

The source/drain electrodes 230 may be formed of one or more of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), for example, and may be a single layer or a multilayer in consideration of conductivity.

A passivation layer (not shown) covering or at least partially covering the thin film transistor 200 may be disposed in order to protect the thin film transistor 200 having such a structure. The passivation layer may be formed of an inorganic material such as silicon oxide, silicon nitride, or silicon oxynitride, for example. The passivation layer may be a single layer or a multilayer.

A planarization layer 150 may be disposed on the passivation layer. For example, when the organic light-emitting device is disposed on the thin film transistor 200 as shown in FIG. 2, the planarization layer 150 may serve to substantially flatten an upper portion of the passivation layer covering or at least partially covering the thin film transistor 200. The planarization layer 150 may include an organic material including a general purpose polymer such as polymethylmethacrylate (PMMA) or polystyrene (PS), a polymer derivative having a phenolic group, an acryl-based polymer, an imide-based polymer, an aryl ether-based polymer, an amide-based polymer, a fluorine-based polymer, a p-xylene-based polymer, a vinyl alcohol-based polymer, and blends thereof, for example, but is not limited thereto. In addition, although the planarization layer 150 is shown as a single layer in FIG. 2, various modifications such as a multilayer are possible. The display panel according to the embodiment of the present disclosure may have the passivation layer and the planarization layer 150 or may have the planarization layer 150 as necessary. The planarization layer 150 may be referred to as a first insulation layer.

In the active area AA of the substrate 110, the organic light-emitting device includes the anode electrode 240, a cathode electrode 250 and a light-emitting layer interposed therebetween. Here, the organic light-emitting device is described as an organic material layer including the light-emitting layer, but more inclusively may be considered as including the anode electrode 240 and the cathode electrode 250, which are essential elements for emitting light.

The planarization layer 150 includes an open portion exposing at least one of the source/drain electrodes 230 of the thin film transistor 200, and the anode electrode 240, which is electrically connected to one of the source/drain electrodes 230 through the open portion, is disposed on the planarization layer 150. The anode electrode 240 may be formed of a conductive material having relatively high work function. The anode electrode 240 may be a (semi)transparent electrode or a reflective electrode. When the anode electrode 240 is a (semi)transparent electrode, the anode electrode 240 may include ITO, IZO, ZnO, $In_2O_3$, IGO or AZO, for example. When the anode electrode 240 is a reflective electrode, the anode electrode 240 may include a reflective layer formed of Ag, Mg, Al, Pt, Pd, Au, Ni, Nd, Ir, Cr or an alloy thereof and a layer formed of ITO, IZO, ZnO, $In_2O_3$, IGO or AZO. However, the present disclosure is not limited thereto. The anode electrode 240 may include various materials and may have a structure of a single layer or a multilayer. Various modifications can be made. Although described as the anode electrode 240 in this embodiment, it may be referred to as a pixel electrode or a first electrode.

A bank layer 160 may be disposed on the planarization layer 150. In some embodiments, the bank layer 160 serves to define a pixel by having an opening corresponding to each subpixel, that is, an opening through which at least a central portion of the anode electrode 240 is exposed. In addition, as shown in FIG. 2, the bank layer 160 increases a distance between an edge of the anode electrode 240 and the cathode electrode over the anode electrode 240, so that the bank layer 160 serves to prevent arcs from occurring at the edge of the anode electrode 240. The bank layer 160 may be formed of an organic material such as polyimide or hexamethyldisiloxane (HMDSO), for example. The bank layer 160 may be referred to as a second insulation layer or a pixel defining layer.

An intermediate layer of the organic light-emitting device may include a low molecular weight or high molecular weight material. When the intermediate layer includes a low molecular weight material, the intermediate layer may have a structure in which a hole injection layer (HIL), a hole transport layer (HTL), an emission layer (EML), an electron transport layer (ETL), an electron injection layer (EIL), and so on are stacked singly or complexly and may include various organic materials such as copper phthalocyanine (CuPc), N,N-di(naphthalen-1-yl)-N,N'-di Phenyl-benzidine (N,N'-Di(naphthalene-1-yl)-N,N'-diphenyl-benzidine: NPB), tris-8-hydroxyquinoline aluminum (Alq3), and the like. These layers may be formed through a vacuum evaporation method.

When the intermediate layer includes a high molecular weight material, the intermediate layer may have a structure including a hole transport layer (HTL) and an emission layer (EML). At this time, the hole transport layer may include PEDOT, and the emission layer may include a polymer material such as PPV (Poly-Phenylenevinylene) and Polyfluorene. The intermediate layer may be formed through a screen printing or inkjet printing method or a laser induced thermal imaging method.

However, the intermediate layer is not necessarily limited thereto and may have various structures.

The cathode electrode 250 is disposed on the active area AA, and as shown in FIG. 2, the cathode electrode 250 may be disposed to cover or at least partially cover the active area AA. That is, the cathode electrode 250 may be formed as one body with respect to the plurality of organic light-emitting devices and may correspond to the plurality of anode electrodes 240. The cathode electrode 250 may be a (semi) transparent electrode or a reflective electrode.

When the cathode electrode 250 is a (semi)transparent electrode, the cathode electrode 250 may have a layer formed of a metal having relatively low work function such as Li, Ca, LiF/Ca, LiF/Al, Al, Ag, Mg or an alloy thereof and a (semi)transparent conductive layer formed of ITO, IZO, ZnO, $In_2O_3$. When the cathode electrode 250 is a reflective electrode, the cathode electrode 250 may have a layer formed of Li, Ca, LiF/Ca, LiF/Al, Al, Ag, Mg or an alloy thereof. However, the configuration and material of the cathode electrode 250 are not limited thereto, and various modifications can be made.

Since the display device such as the organic light-emitting device includes the cathode electrode 250, a predetermined electrical signal is applied to the cathode electrode 250 in order to display an image. Accordingly, the low voltage supply line 410 is positioned in the inactive area IA to transmit the predetermined electrical signal to the cathode electrode 250. Although described as the cathode electrode 250 in this embodiment, it may be referred to as a cathode, an opposite electrode, an upper electrode or a second electrode.

Referring to FIG. 2, a cross-section of the inactive area IA disposed on a side of the active area AA along the cutting line I-I' of FIG. 1 can be seen. In the inactive area IA, a gate driving portion 300, a plurality of dam structures 170, and a crack stopper structure 460 may be arranged in an order adjacent to the active area AA. The gate driving portion 300 may be the GIP circuit. The gate driving portion 300 may include an emission signal driving circuit 310 (which may be referred to herein as an emission signal driving unit 310), a scan signal driving circuit 320 (which may be referred to herein as a scan signal driving unit 320), and a link circuit 330 (which may be referred to herein as a link unit 330). The emission signal driving unit 310 may include any electrical circuitry, features, components, an assembly of electronic components or the like configured to perform the various operations of the emission signal driving features as described herein. Similarly, the scan signal driving unit 320 may include any electrical circuitry, features, components, an assembly of electronic components or the like configured to perform the various operations of the scan signal driving features as described herein. Similarly, the link unit 330 may include any electrical circuitry, features, components, an assembly of electronic components or the like configured to perform the various operations of the link features as described herein. In some embodiments, the emission signal driving unit 310, the scan signal driving unit 320, the link unit 330 may be included in or otherwise implemented by processing circuitry such as a microprocessor, microcontroller, integrated circuit, chip, microchip or the like.

The circuit configuration may vary according to the configuration of the organic light-emitting device, and the gate driving portion 300 may transmit at least one emission control signal and at least one scan control signal to the subpixel including the organic light-emitting device. The link unit 330 may be disposed between the emission signal driving unit 310 and the organic light-emitting device and between the scan signal driving unit 320 and the organic light-emitting device for transmitting the signals. Each of the emission signal driving unit 310 and the scan signal driving unit 320 may include a plurality of transistors and at least one capacitor.

The planarization layer 150 may be disposed on the gate driving portion 300 as described in the active area AA, and a metal layer formed of the same material as the anode electrode 240 may be disposed on the planarization layer 150. The metal layer formed of the same material as the anode electrode 240 may be referred to as a connection electrode 740. At least one outgassing pattern 750 may be provided in the connection electrode 740. The outgassing pattern 750 may be disposed in the inactive area IA and may have a hole shape for discharging hydrogen gas ($H_2$) that may be generated in the planarization layer 150 during a heat treatment process of processes for manufacturing the display panel 100. The connection electrode 740 and the outgassing pattern 750 may overlap with the gate driving portion 300 of the inactive area IA in at least some sections. The bank layer 160 disposed in the active area AA may extend over the connection electrode 740 in the inactive area IA. The cathode electrode 250 disposed in the active area AA may extend over the bank layer 160 in the inactive area IA.

Referring to FIG. 2, the gate driving portion 300 includes the emission signal driving unit 310 and the scan signal driving unit 320, and for example, the emission signal driving unit 310 may be disposed outside the scan signal driving unit 320. That is, the scan signal driving unit 320 may be disposed between the emission signal driving unit 310 and the active area AA. However, the positions of the emission signal driving unit 310 and the scan signal driving unit 320 are not limited thereto. In order to prevent permeation of moisture from the outside, an isolation structure may be formed between the emission signal driving unit 310 and the scan signal driving unit 320 for disconnecting parts of the planarization layer 150 and the bank layer 160, which are the main paths of the moisture. For example, the planarization layer 150 and the bank layer 160 may be etched, thereby forming a hole exposing the inorganic insulation layer 140 or the gate insulation layer 130. The external moisture moving through the planarization layer 150 and the bank layer 160 may not move at the etched portion. The connection electrode 740 and the cathode electrode 250 may be disposed on the hole. A structure in which the connection electrode 740 and the cathode electrode 250 are disposed in the etched portion of the planarization layer 150 and the bank layer 160 and connected to each other may be a contact area 600. The contact area 600 may include a contact guarantee area 610 and a contact hole 620. The cathode electrode 250 and the connection electrode 740 may be electrically contacted to each other through the contact area 600, and the connection electrode 740 may extend into a periphery of the inactive area IA to be connected to the low voltage supply line 410. The plurality of dam structures 170 may be disposed near an area where the connection electrode 740 and the low voltage supply line 410 are connected. The plurality of dam structures 170 may form an encapsulation layer to prevent permeation of the external moisture after the organic light-emitting device is formed. The dam structures 170 may prevent an organic layer of the encapsulation layer from flowing down to the periphery of the substrate 110. The crack stopper structure 460 described above may be disposed to be spaced apart from the plurality of dam structures 170 toward the periphery of the substrate 110 by a predetermined distance.

To prevent the permeation of the external moisture, the contact area 600 may serve to cut off the organic insulation layer, which is a main path of the moisture permeation, thereby disconnecting the extension of the organic insulation layer to the active area AA. In addition, an electrical connection point of the cathode electrode 250 and the connection electrode 740 may be moved from the outside of the gate driving portion 300 to the inside. The electrical connection point of the cathode electrode 250 and the connection electrode 740, which was disposed in the outside of the gate driving portion 300, may be moved into the inside where the gate driving portion 300 is disposed, so that a space occupied by the bezel area may be reduced. The contact area 600 may be disposed to overlap with the area where the gate driving portion 300 is arranged, and thus the plurality of dam structures 170 and the crack stopper structure 460 may be disposed closer to the active area AA.

The contact area 600 may have a stepped structure such that the cathode electrode 250 and the connection electrode 740 may contact each other well. For example, a width of a first isolation structure for disconnecting the planarization layer 150 may be different from a width of a second isolation structure for disconnecting the bank layer 160. The width of the second isolation structure of the bank layer 160 may be wider than the width of the first isolation structure of the planarization layer 150, so that the connection electrode 740 may be formed along the first isolation structure of the planarization layer 150. When the cathode electrode 250 is formed along the second isolation structure of the bank layer 160, as shown in FIG. 2, it can be seen that the connection electrode 740 and the cathode electrode 250 may have a certain step shape and contact each other. An area where the width of the first isolation structure of the planarization layer 150 and the width of the second isolation structure of the bank layer 160 are different may be referred to as the contact guarantee area 610. If the planarization layer 150 and the bank layer 160 are etched at a time, the process may be simple. However, the connection electrode 740 and the cathode electrode 250 may have to be connected to each other through a vertical sidewall of the isolation structure. In addition, a bottom area of the isolation structure may be very narrow. For example, considering that a residual layer may remain in the planarization layer 150 when the first isolation structure of the planarization layer 150 is formed, over-etching may be performed up to the inorganic insulation layer 140 under the planarization layer 150. At this time, an isolation structure of the etched inorganic insulation layer 140 may be formed to be small. When it is considered that the cathode electrode 250 is formed to be very thin to a thickness of about 100~200 Å, the cathode electrode 250 and the connection electrode 740 may not be in stable electrical contact with each other through the sidewall or the bottom of the isolation structure. In order to stably contact the cathode electrode 250 and the connection electrode 740, the contact guarantee area 610 may be disposed. The isolation structures of the planarization layer 150 and the bank layer 160 may be separately formed through respective processes. By differing centers of the isolation structures or the widths of the isolation structures, a spot where the connection electrode 740 is formed to be flat on the planarization layer 150 may be formed. When the cathode electrode 250 is formed on the spot where the connection electrode 740 is formed to be flat, a more stable contact may be achieved.

The contact guarantee area 610 may be disposed near the active area AA with respect to a center of the contact area 600. The closer to the active area AA the contact between the cathode electrode 250 and the connection electrode 740 is, the more advantageous the resistance of the cathode electrode 250 is, and the contact point of the cathode electrode 250 and the connection electrode 740 is also protected against the permeation of the external moisture.

The contact area 600 may be disposed between the emission signal driving unit 310 and the scan signal driving unit 320 of the gate driving portion 300. Since the contact area 600 is close to the active area AA as much as the space of the emission signal driving unit 310, there are advantages that the space of the bezel area can be saved and the permeation of the external moisture can be prevented in the periphery of the gate driving portion 300. However, for the space arrangement, it is beneficial to change a design of the gate driving portion 300 and to partially adjust the distance between the emission signal driving unit 310 and the scan signal driving unit 320, thereby disposing the contact area 600.

The contact area 600, referring to FIG. 1, may be disposed on the left and right sides of the active area AA where the gate driving portion 300 is arranged. In addition, the contact area 600 may be disposed on the up side of the active area AA and the down side of the active area AA where the pad 450 is arranged. On the other hand, since the gate driving portion 300 may not be disposed on the up and down sides of the active area AA, the contact area 600 may be freely designed on the up and down sides of the active area AA regardless of the position of the gate driving portion 300.

Figure 3:
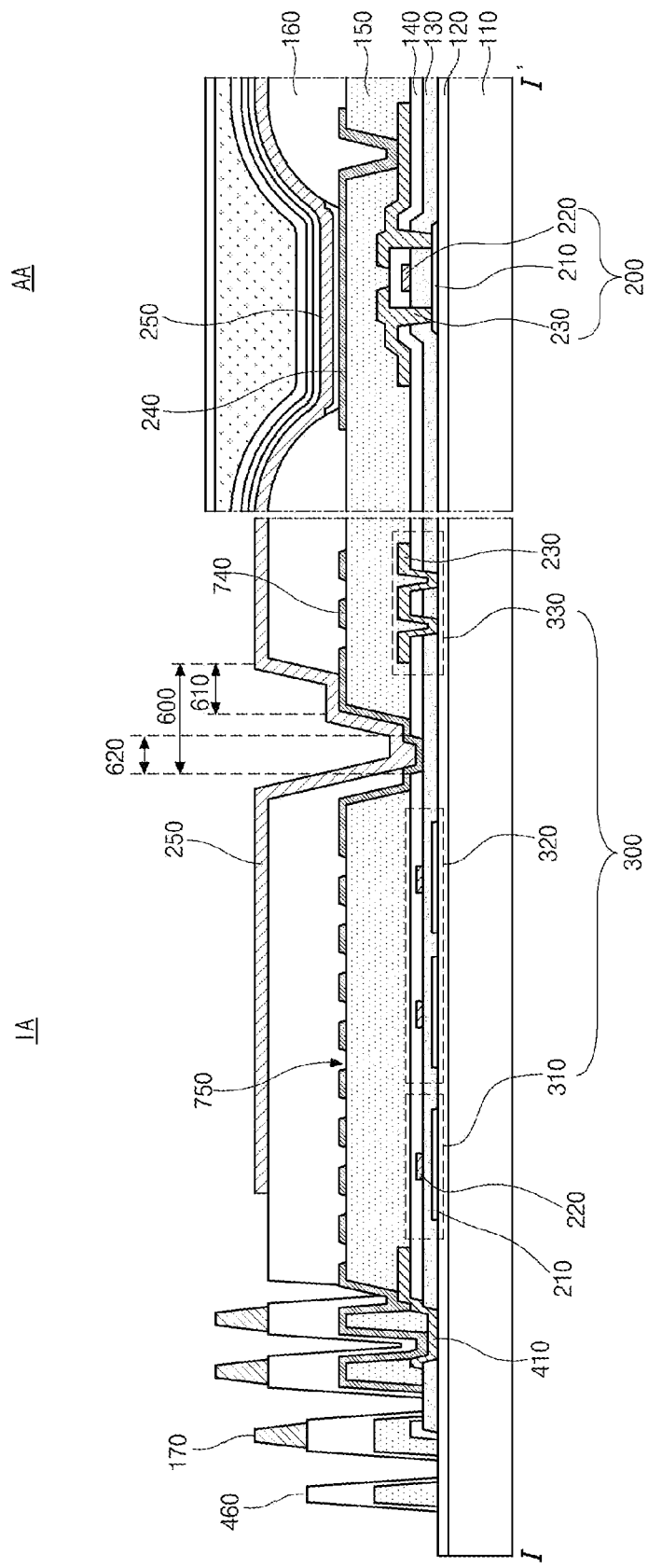
FIG. 3 is a cross-sectional view of a display panel according to another embodiment taken along the cutting line I-I' of FIG. 1.

FIG. 3 shows a cross-section of the inactive area IA disposed on the side of the active area AA along the cutting line I-I' of FIG. 1. The description of the active area of FIG. 3 is the same as that of FIG. 2 and will be omitted. Referring to FIG. 3, in the inactive area IA, a gate driving portion 300, a plurality of dam structures 170, and a crack stopper structure 460 may be arranged in an order adjacent to the active area AA. The gate driving portion 300 may be a GIP circuit. The gate driving portion 300 may include an emission signal driving unit 310, a scan signal driving unit 320 and a link unit 330. The circuit configuration may vary according to the configuration of the organic light-emitting device, and the gate driving portion 300 may transmit at least one emission control signal and at least one scan control signal to the subpixel including the organic light-emitting device. The link unit 330 may be disposed between the emission signal driving unit 310 and the organic light-emitting device and between the scan signal driving unit 320 and the organic light-emitting device for transmitting the signals. Each of the emission signal driving unit 310 and the scan signal driving unit 320 may include a plurality of transistors and at least one capacitor. A planarization layer 150 may be disposed on the gate driving portion 300 as described in the active area AA, and a metal layer formed of the same material as the anode electrode 240 may be disposed on the planarization layer 150. The metal layer formed of the same material as the anode electrode 240 may be referred to as a connection electrode 740. At least one outgassing pattern 750 may be provided in the connection electrode 740. The outgassing pattern 750 may be disposed in the inactive area IA and may have a hole shape for discharging hydrogen gas ($H_2$) that may be generated in the planarization layer 150 during a heat treatment process of processes for manufacturing the display panel 100. The connection electrode 740 and the outgassing pattern 750 may overlap with the gate driving portion 300 of the inactive area IA in at least some sections. The bank layer 160 disposed in the active area AA may extend over the connection electrode 740 in the inactive area IA. The cathode electrode 250 disposed in the active area AA may extend over the bank layer 160 in the inactive area IA.

Referring to FIG. 3, the gate driving portion 300 includes the emission signal driving unit 310 and the scan signal driving unit 320, and for example, the emission signal driving unit 310 may be disposed outside the scan signal driving unit 320. That is, the scan signal driving unit 320 may be disposed between the emission signal driving unit 310 and the active area AA. However, the positions of the emission signal driving unit 310 and the scan signal driving unit 320 are not limited thereto. In order to prevent permeation of moisture from the outside, an isolation structure may be formed between the scan signal driving unit 320 and the link unit 330 for disconnecting parts of the planarization layer 150 and the bank layer 160, which are the main paths of the moisture. For example, the planarization layer 150 and the bank layer 160 may be etched, thereby forming a hole exposing the inorganic insulation layer 140 or the gate insulation layer 130. The external moisture moving through the planarization layer 150 and the bank layer 160 may not move at the etched portion. The connection electrode 740 and the cathode electrode 250 may be disposed on the hole. A structure in which the connection electrode 740 and the cathode electrode 250 are disposed in the etched portion of the planarization layer 150 and the bank layer 160 and connected to each other may be a contact area 600. The contact area 600 may include a contact guarantee area 610 and a contact hole 620. The cathode electrode 250 and the connection electrode 740 may be electrically contacted to each other through the contact area 600, and the connection electrode 740 may extend into a periphery of the inactive area IA to be connected to a low voltage supply line 410. The plurality of dam structures 170 may be disposed near an area where the connection electrode 740 and the low voltage supply line 410 are connected. The plurality of dam structures 170 may form an encapsulation layer to prevent permeation of the external moisture after the organic light-emitting device is formed. The dam structures 170 may prevent an organic layer of the encapsulation layer from flowing down to the periphery of the substrate 110. The crack stopper structure 460 described above may be disposed to be spaced apart from the plurality of dam structures 170 toward the periphery of the substrate 110 by a predetermined distance.

To prevent the permeation of the external moisture, the contact area 600 may serve to cut off the organic insulation layer, which is a main path of the moisture permeation, thereby disconnecting the extension of the organic insulation layer to the active area AA. In addition, an electrical connection point of the cathode electrode 250 and the connection electrode 740 may be moved from the outside of the gate driving portion 300 to the inside. The electrical connection point of the cathode electrode 250 and the connection electrode 740, which was disposed in the outside of the gate driving portion 300, may be moved into the inside where the gate driving portion 300 is disposed, so that a space occupied by the bezel area may be reduced. The contact area 600 may be disposed to overlap with the area where the gate driving portion 300 is arranged, and thus the plurality of dam structures 170 and the crack stopper structure 460 may be disposed closer to the active area AA.

The contact area 600 may have a stepped structure such that the cathode electrode 250 and the connection electrode 740 may contact each other well. For example, a width of a first isolation structure for disconnecting the planarization layer 150 may be different from a width of a second isolation structure for disconnecting the bank layer 160. The width of the second isolation structure of the bank layer 160 may be wider than the width of the first isolation structure of the planarization layer 150, so that the connection electrode 740 may be formed along the first isolation structure of the planarization layer 160. When the cathode electrode 250 is formed along the second isolation structure of the bank layer 150, as shown in FIG. 3, it can be seen that the connection electrode 740 and the cathode electrode 250 may have a certain step shape and contact each other. An area where the width of the first isolation structure of the planarization layer 150 and the width of the second isolation structure of the bank layer 160 are different may be referred to as a contact guarantee area 610. If the planarization layer 150 and the bank layer 160 are etched at a time, the process may be simple. However, the connection electrode 740 and the cathode electrode 250 may have to be connected to each other through a vertical sidewall of the isolation structure. In addition, a bottom area of the isolation structure may be very narrow. For example, considering that a residual layer may remain in the planarization layer 150 when the first isolation structure of the planarization layer 150 is formed, over-etching may be performed up to the inorganic insulation layer 140 under the planarization layer 150. At this time, an isolation structure of the etched inorganic insulation layer 140 may be formed to be small. When it is considered that the cathode electrode 250 is formed to be very thin to a thickness of about 100~200 Å, the cathode electrode 250 and the connection electrode 740 may not be in stable electrical contact with each other through the sidewall or the bottom of the isolation structure. In order to stably contact the cathode electrode 250 and the connection electrode 740, the contact guarantee area 610 may be disposed. The isolation structures of the planarization layer 150 and the bank layer 160 may be separately formed through respective processes. By differing centers of the isolation structures or the widths of the isolation structures, a spot where the connection electrode 740 is formed to be flat on the planarization layer 150 may be formed. When the cathode electrode 250 is formed on the spot where the connection electrode 740 is formed to be flat, a more stable contact may be achieved.

The contact guarantee area 610 may be disposed near the active area AA with respect to a center of the contact area 600. The closer to the active area AA the contact between the cathode electrode 250 and the connection electrode 740 is, the more advantageous the resistance of the cathode electrode 250 is, and the contact point of the cathode electrode 250 and the connection electrode 740 is also protected against the permeation of the external moisture.

The contact area 600 may be disposed between the scan signal driving unit 320 and the link unit 330 of the gate driving portion 300. Since the contact area 600 is close to the active area AA as much as the space of the emission signal driving unit 310 and the scan signal driving unit 320, there are advantages that the space of the bezel area can be saved and the permeation of the external moisture can be prevented in the middle of the gate driving portion 300. Since the contact area 600 is closer to the active area AA as compared to FIG. 2, the permeated moisture may propagate to an area relatively close to the organic light-emitting device. However, it may be advantageous in electrical resistance of the display panel 100 that the cathode electrode 250 contacts the connection electrode 740 near the active area AA as compared to FIG. 2. For example, the connection electrode 740, which has lower resistance than the cathode electrode 250, may have a longer distance than the structure of FIG. 2, thereby reducing the overall resistance of the low voltage supply line 410.

The contact area 600, referring to FIG. 1, may be disposed on the left and right sides of the active area AA where the gate driving portion 300 is arranged. In addition, the contact area 600 may be disposed on the up side of the active area AA and the down side of the active area AA where the pad 450 is arranged. On the other hand, since the gate driving portion 300 may not be disposed on the up and down sides of the active area AA, the contact area 600 may be freely designed on the up and down sides of the active area AA regardless of the position of the gate driving portion 300.

Figure 4:
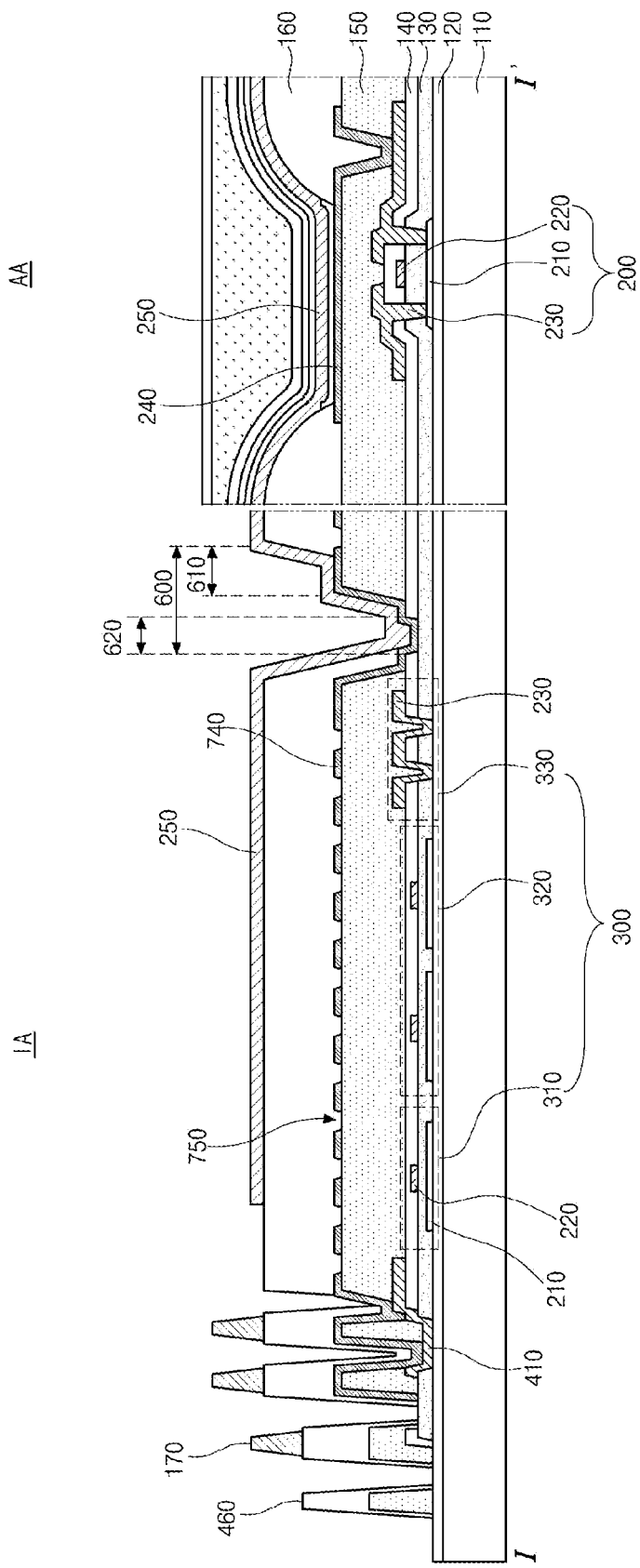
FIG. 4 is a cross-sectional view of a display panel according to another embodiment taken along the cutting line I-I' of FIG. 1.

FIG. 4 shows a cross-section of the inactive area IA disposed on the side of the active area AA along the cutting line I-I' of FIG. 1. The description of the active area of FIG. 4 is the same as those of FIG. 2 and FIG. 3 and will be omitted. Referring to FIG. 4, in the inactive area IA, a gate driving portion 300, a plurality of dam structures 170, and a crack stopper structure 460 may be arranged in an order adjacent to the active area AA. The gate driving portion 300 may be a GIP circuit. The gate driving portion 300 may include an emission signal driving unit 310, a scan signal driving unit 320 and a link unit 330. The circuit configuration may vary according to the configuration of the organic light-emitting device, and the gate driving portion 300 may transmit at least one emission control signal and at least one scan control signal to the subpixel including the organic light-emitting device. The link unit 330 may be disposed between the emission signal driving unit 310 and the organic light-emitting device and between the scan signal driving unit 320 and the organic light-emitting device for transmitting the signals. Each of the emission signal driving unit 310 and the scan signal driving unit 320 may include a plurality of transistors and at least one capacitor. A planarization layer 150 may be disposed on the gate driving portion 300 as described in the active area AA, and a metal layer formed of the same material as the anode electrode 240 may be disposed on the planarization layer 150. The metal layer formed of the same material as the anode electrode 240 may be referred to as a connection electrode 740. At least one outgassing pattern 750 may be provided in the connection electrode 740. The outgassing pattern 750 may be disposed in the inactive area IA and may have a hole shape for discharging hydrogen gas ($H_2$) that may be generated in the planarization layer 150 during a heat treatment process of processes for manufacturing the display panel 100. The connection electrode 740 and the outgassing pattern 750 may overlap with the gate driving portion 300 of the inactive area IA in at least some sections. The bank layer 160 disposed in the active area AA may extend over the connection electrode 740 in the inactive area IA. The cathode electrode 250 disposed in the active area AA may extend over the bank layer 160 in the inactive area IA.

Referring to FIG. 4, the gate driving portion 300 includes the emission signal driving unit 310 and the scan signal driving unit 320, and for example, the emission signal driving unit 310 may be disposed outside the scan signal driving unit 320. That is, the scan signal driving unit 320 may be disposed between the emission signal driving unit 310 and the active area AA. However, the positions of the emission signal driving unit 310 and the scan signal driving unit 320 are not limited thereto. In order to prevent permeation of moisture from the outside, an isolation structure may be formed between the link unit 330 and the active area AA for disconnecting parts of the planarization layer 150 and the bank layer 160, which are the main paths of the moisture. For example, the planarization layer 150 and the bank layer 160 may be etched, thereby forming a hole exposing the inorganic insulation layer 140 or the gate insulation layer 130. The external moisture moving through the planarization layer 150 and the bank layer 160 may not move at the etched portion. The connection electrode 740 and the cathode electrode 250 may be disposed on the hole. A structure in which the connection electrode 740 and the cathode electrode 250 are disposed in the etched portion of the planarization layer 150 and the bank layer 160 and connected to each other may be a contact area 600. The contact area 600 may include a contact guarantee area 610 and a contact hole 620. The cathode electrode 250 and the connection electrode 740 may be electrically contacted to each other through the contact area 600, and the connection electrode 740 may extend into a periphery of the inactive area IA to be connected to a low voltage supply line 410. The plurality of dam structures 170 may be disposed near an area where the connection electrode 740 and the low voltage supply line 410 are connected. The plurality of dam structures 170 may form an encapsulation layer to prevent permeation of the external moisture after the organic light-emitting device is formed. The dam structures 170 may prevent an organic layer of the encapsulation layer from flowing down to the periphery of the substrate 110. The crack stopper structure 460 described above may be disposed to be spaced apart from the plurality of dam structures 170 toward the periphery of the substrate 110 by a predetermined distance.

To prevent the permeation of the external moisture, the contact area 600 may serve to cut off the organic insulation layer, which is a main path of the moisture permeation, thereby disconnecting the extension of the organic insulation layer to the active area AA. In addition, an electrical connection point of the cathode electrode 250 and the connection electrode 740 may be moved from the outside of the gate driving portion 300 to the inside. The electrical connection point of the cathode electrode 250 and the connection electrode 740, which was disposed in the outside of the gate driving portion 300, may be moved into the inside where the gate driving portion 300 is disposed, so that a space occupied by the bezel area may be reduced. The contact area 600 may be disposed to overlap with the area where the gate driving portion 300 is arranged, and thus the plurality of dam structures 170 and the crack stopper structure 460 may be disposed closer to the active area AA.

The contact area 600 may have a stepped structure such that the cathode electrode 250 and the connection electrode 740 may contact each other well. For example, a width of a first isolation structure for disconnecting the planarization layer 150 may be different from a width of a second isolation structure for disconnecting the bank layer 160. The width of the second isolation structure of the bank layer 160 may be wider than the width of the first isolation structure of the planarization layer 150, so that the connection electrode 740 may be formed along the first isolation structure of the planarization layer 150. When the cathode electrode 250 is formed along the second isolation structure of the bank layer 160, as shown in FIG. 4, it can be seen that the connection electrode 740 and the cathode electrode 250 may have a certain step shape and contact each other. An area where the width of the first isolation structure of the planarization layer 150 and the width of the second isolation structure of the bank layer 160 are different may be referred to as a contact guarantee area 610. If the planarization layer 150 and the bank layer 160 are etched at a time, the process may be simple. However, the connection electrode 740 and the cathode electrode 250 may have to be connected to each other through a vertical sidewall of the isolation structure. In addition, a bottom area of the isolation structure may be very narrow. For example, considering that a residual layer may remain in the planarization layer 150 when the first isolation structure of the planarization layer 150 is formed, over-etching may be performed up to the inorganic insulation layer 140 under the planarization layer 150. At this time, an isolation structure of the etched inorganic insulation layer 140 may be formed to be small. When it is considered that the cathode electrode 250 is formed to be very thin to a thickness of about 100~200 Å, the cathode electrode 250 and the connection electrode 740 may not be in stable electrical contact with each other through the sidewall or the bottom of the isolation structure. In order to stably contact the cathode electrode 250 and the connection electrode 740, the contact guarantee area 610 may be disposed. The isolation structures of the planarization layer 150 and the bank layer 160 may be separately formed through respective processes. By differing centers of the isolation structures or the widths of the isolation structures, a spot where the connection electrode 740 is formed to be flat on the planarization layer 150 may be formed. When the cathode electrode 250 is formed on the spot where the connection electrode 740 is formed to be flat, a more stable contact may be achieved.

The contact guarantee area 610 may be disposed near the active area AA with respect to a center of the contact area 600. The closer to the active area AA the contact between the cathode electrode 250 and the connection electrode 740 is, the more advantageous the resistance of the cathode electrode 250 is, and the contact point of the cathode electrode 250 and the connection electrode 740 is also protected against the permeation of the external moisture.

The contact area 600 may be disposed between the link unit 330 of the gate driving portion 300 and the active area AA. Since the contact area 600 is close to the active area AA as much as the space of the gate driving portion 300, there are advantages that the space of the bezel area can be saved and the permeation of the external moisture can be prevented around the gate driving portion 300, that is, between the gate driving portion 300 and the active area AA. Since the contact area 600 is closer to the active area AA as compared to FIG. 2 and FIG. 3, the permeated moisture may propagate to an area close to the organic light-emitting device. However, it may be advantageous in electrical resistance of the display panel 100 that the cathode electrode 250 contacts the connection electrode 740 near the active area AA as compared to FIG. 2 and FIG. 3. For example, the connection electrode 740, which has lower resistance than the cathode electrode 250, may have a longer distance than the structures of FIG. 2 and FIG. 3, thereby reducing the overall resistance of the low voltage supply line 410. In addition, since the contact area 600 is formed in a relatively large area between the gate driving portion 300 and the active area AA, it can be reduced or minimized to change a design of the gate driving portion 300. Further, the space for the bezel can be saved (and in some cases maximally saved), thereby enabling extreme design for the narrow bezel.

The contact area 600, referring to FIG. 1, may be disposed to surround four sides of the active area AA.

Figure 5:
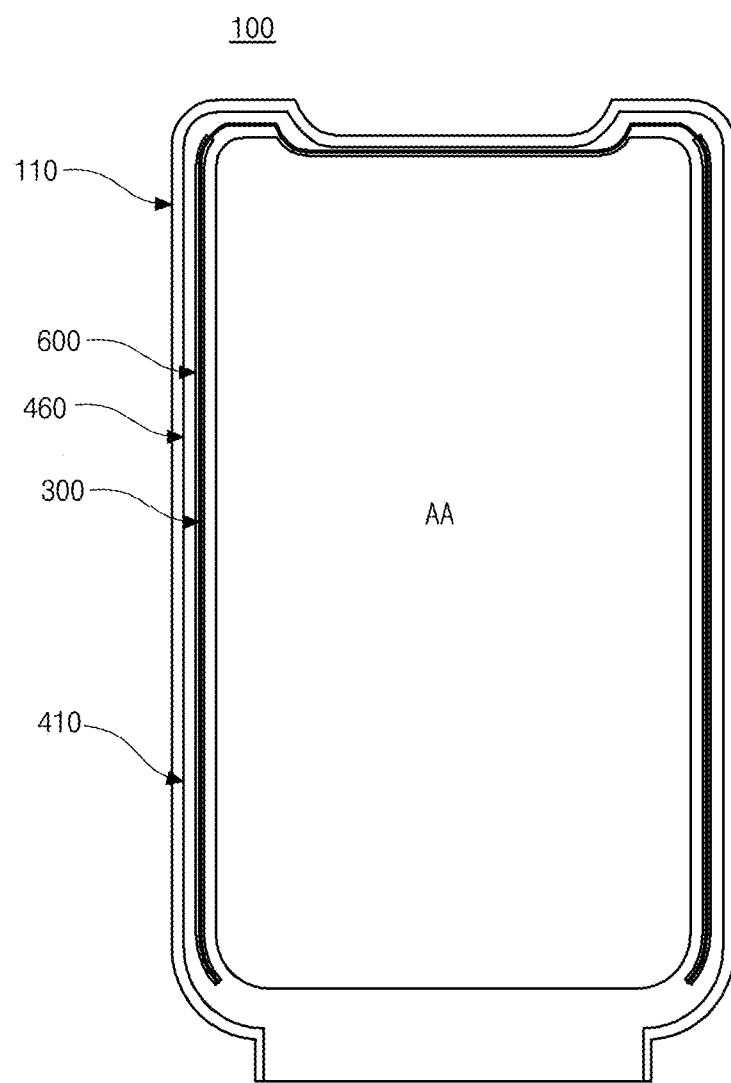
FIG. 5 is a plan view of a display panel to which a connection structure of the embodiment is applied.

FIG. 5 illustrates the contact area 600 omitted in FIG. 1 on a plane of the display panel 100. The contact area 600 may be disposed on the left and right sides of the active area AA where the gate driving portion 300 is arranged, but is not limited thereto. For example, the contact area 600 may also be disposed on the up and down sides of the active area AA, thereby surrounding four sides of the active area AA.

The display apparatus according to the embodiment of the present disclosure includes a liquid crystal display device (LCD), a field emission display device (FED), an organic light-emitting display device (OLED), and a quantum dot display device.

The display apparatus according to the embodiment of the present disclosure may include a complete product or final product including an LCM or an OLED module such as a notebook computer, a television, a computer monitor, an equipment display apparatus including an automotive display apparatus or a different type of vehicle, a set electronic device apparatus such as a mobile electronic device apparatus of a smartphone or an electronic pad, or a set device or set apparatus.

The display apparatus according to the embodiment of the present disclosure may be described as follows.

The display apparatus according to the embodiment of the present disclosure may include a display panel including an active area, an inactive area disposed around the active area, and a connection area disposed in the inactive area, wherein the active area may include an anode electrode, a light-emitting layer and a cathode electrode, wherein the inactive area may include a gate driving portion and a crack stopper pattern, and wherein the connection area may be disposed adjacent to the gate driving portion and the cathode electrode and a connection electrode disposed on the gate driving portion may contact each other in the connection area.

In the display apparatus according to the embodiment of the present disclosure, the anode electrode and the connection electrode may be formed of a same material.

In the display apparatus according to the embodiment of the present disclosure, the gate driving portion may include an emission signal driving unit, a scan signal driving unit and a link unit.

In the display apparatus according to the embodiment of the present disclosure, the connection area may be disposed between the emission signal driving unit and the scan signal driving unit.

In the display apparatus according to the embodiment of the present disclosure, the connection area may include a contact hole and a connection assistance area.

In the display apparatus according to the embodiment of the present disclosure, the connection assistance area may be disposed between the contact hole and the active area.

In the display apparatus according to the embodiment of the present disclosure, the connection area may be disposed between the scan signal driving unit and the link unit.

In the display apparatus according to the embodiment of the present disclosure, the connection area may be disposed between the link unit and the active area.

In the display apparatus according to the embodiment of the present disclosure, the inactive area may further include a low voltage supply line and a dam structure, and the connection electrode may be connected to the low voltage supply line in an area adjacent to the dam structure.

In the display apparatus according to the embodiment of the present disclosure, the inactive area may include a planarization layer and a bank layer extending from the active area, and the connection area may include a first part where the planarization layer is removed and a second part where the bank layer is removed in the inactive area.

In the display apparatus according to the embodiment of the present disclosure, the first part and the second part may have different widths.

The display apparatus according to the embodiment of the present disclosure may include a display panel including an active area and an inactive area, the active area including a thin film transistor, and a planarization layer, a first electrode, a bank layer, a light-emitting layer and a second electrode are sequentially disposed on the thin film transistor, the inactive area including a gate driving portion, a dam structure and a crack stopper structure, and a connection area in which a connection electrode disposed on the gate driving portion is connected to an extension part of the second electrode.

In the display apparatus according to the embodiment of the present disclosure, the gate driving portion may include an emission signal driving unit, a scan signal driving unit and a link unit, and the connection area may be disposed between the emission signal driving unit and the scan signal driving unit.

In the display apparatus according to the embodiment of the present disclosure, the gate driving portion may include an emission signal driving unit, a scan signal driving unit and a link unit, and the connection area may be disposed between the scan signal driving unit and the link unit.

In the display apparatus according to the embodiment of the present disclosure, the connection area may include a first part and a second part, wherein the first part has a first width and the second part has a second width, and wherein the first width and the second width are different from each other, and the connection area further includes a connection assistance area disposed on the planarization layer exposed in an area where the bank layer is removed due to a difference between the first width and the second width.

In the display apparatus according to the embodiment of the present disclosure, the connection assistance area may be disposed closer to the active area than a center of the connection area.

In the display apparatus according to the embodiment of the present disclosure, the first electrode and the connection electrode may be formed of a same material.

In the display apparatus according to the embodiment of the present disclosure, the inactive area may further include a low voltage supply line, wherein at least a part of the low voltage supply line is disposed under the dam structure, and the connection electrode may be connected to the low voltage supply line around the dam structure.

Features, structures, effects, and the like described in the examples of the present disclosure are included in at least one example, and are not necessarily limited to only one example. Further, the features, structures, effects, and the like exemplified in at least one example of the present disclosure may be combined or modified for other examples by person skilled in the art to which the present disclosure belongs. Accordingly, contents related to such combinations and modifications should be construed as being included in the scope of the present disclosure.

The present disclosure is not limited to the above-described embodiments and the accompanying drawings, and it will be apparent to a person skilled in the art to which the present disclosure belongs that various substitutions, modifications and changes can be made within the range without departing from the technical sprit or scope of the present disclosure. Accordingly, the scope of the present disclosure is indicated by the claims to be described later, and all changes or modified forms derived from the meaning and scope of the claims and their equivalent concepts should be interpreted as being included in the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus, comprising:
  a display panel including an active area, an inactive area disposed adjacent to the active area, and a connection area disposed in the inactive area,
  wherein the active area includes an anode electrode, a light-emitting layer, and a cathode electrode over a substrate,
  wherein the inactive area includes a gate driving portion and a crack stopper pattern,
  wherein the gate driving portion includes an emission signal driving circuit, a scan signal driving circuit, and a link circuit,
  wherein the connection area is disposed between the emission signal driving circuit and the active area,
  wherein a connection electrode is disposed in the connection area,
  wherein a planarization layer is disposed between the connection electrode and the substrate,
  wherein a first insulation layer is disposed between the planarization layer and the substrate, and
  wherein the connection electrode extends downwards in the connection area and directly contacts a top surface of the first insulation layer.

2. The display apparatus of claim 1, wherein the anode electrode and the connection electrode are formed of a same material.

3. The display apparatus of claim 1, wherein the connection area is disposed between the emission signal driving circuit and the scan signal driving circuit.

4. The display apparatus of claim 1, wherein the connection area includes a contact hole and a connection assistance area.

5. The display apparatus of claim 4, wherein the connection assistance area is disposed between the contact hole and the active area.

6. The display apparatus of claim 1, wherein the connection area is disposed between the scan signal driving circuit and the link circuit.

7. The display apparatus of claim 1, wherein the connection area is disposed between the link circuit and the active area.

8. The display apparatus of claim 1, wherein the inactive area further includes a low voltage supply line and a dam structure, and
  wherein the connection electrode is connected to the low voltage supply line in an area adjacent to the dam structure.

9. The display apparatus of claim 1, wherein the inactive area includes a planarization layer and a bank layer extending from the active area, and
  wherein the connection area includes a first part where the planarization layer is removed and a second part where the bank layer is removed in the inactive area.

10. The display apparatus of claim 9, wherein the first part and the second part have different widths.

11. The display apparatus of claim 1, wherein the active area further includes a transistor coupled to the anode electrode, the transistor including a gate insulation layer, and
  wherein the first insulation layer includes the gate insulation layer.

12. The display apparatus of claim 1, wherein a second insulation layer is disposed between the planarization layer and the first insulation layer, and
  wherein the connection electrode contacts a side surface of the second insulation layer.

13. A display apparatus, comprising:
  a display panel including an active area and an inactive area;
  a thin film transistor over a substrate in the active area;
  a planarization layer, an organic light-emitting device, a bank layer, disposed on the thin film transistor, the organic light-emitting device including a first electrode, a second electrode, and a light-emitting layer between the first and second electrodes;
  a gate driving portion, a dam structure, and a crack stopper structure in the inactive area; and
  a connection area having a connection electrode disposed on the gate driving portion,
  wherein the second electrode extends from the active area to the inactive area of the display panel,
  wherein the planarization layer is disposed between the connection electrode and the substrate,
  wherein the connection electrode extends through a hole of the planarization layer at the connection area,
  wherein the second electrode of the organic light-emitting device directly contacts the connection electrode at the hole of the planarization layer, and
  wherein at least a portion of the bank layer is disposed between the connection electrode and the second electrode at the hole of planarization layer.

14. The display apparatus of claim 13, wherein the gate driving portion includes an emission signal driving circuit, a scan signal driving circuit, and a link circuit, and
  wherein the connection area is disposed between the emission signal driving circuit and the scan signal driving circuit.

15. The display apparatus of claim 14, wherein the connection area includes a first part and a second part, wherein the first part has a first width and the second part has a second width, and wherein the first width and the second width are different from each other, and the connection area further includes a connection assistance area disposed on the planarization layer exposed in an area where the bank layer is removed based on a difference between the first width and the second width.

16. The display apparatus of claim 15, wherein the connection assistance area is disposed closer to the active area than a center of the connection area.

17. The display apparatus of claim 13, wherein the gate driving portion includes an emission signal driving circuit, a scan signal driving circuit, and a link circuit, and wherein the connection area is disposed between the scan signal driving circuit and the link circuit.

18. The display apparatus of claim 13, wherein the first electrode and the connection electrode are formed of a same material.

19. The display apparatus of claim 13, wherein the inactive area further includes a low voltage supply line, wherein at least a part of the low voltage supply line is disposed under the dam structure, and wherein the connection electrode is connected to the low voltage supply line around the dam structure.

20. The display apparatus of claim 13, wherein the hole of the planarization layer extends into an insulation layer between the substrate and the planarization layer, and the connection electrode has a step structure in the hole.

* * * * *